(12) United States Patent
Eromäki

(10) Patent No.: US 9,871,954 B2
(45) Date of Patent: Jan. 16, 2018

(54) TWO PART DEVICE WITH CAMERA AND MECHANICAL FLAP

(71) Applicant: Microsoft Technology Licensing, LLC, Redmond, WA (US)

(72) Inventor: Marko Eromäki, Tampere (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/174,988

(22) Filed: Jun. 6, 2016

(65) Prior Publication Data

US 2017/0353633 A1 Dec. 7, 2017

(51) Int. Cl.
| | |
|---|---|
| H04N 5/225 | (2006.01) |
| H05K 5/03 | (2006.01) |
| H04N 5/247 | (2006.01) |
| G06F 3/14 | (2006.01) |
| H05K 5/02 | (2006.01) |

(52) U.S. Cl.
CPC ......... *H04N 5/2252* (2013.01); *G06F 3/1446* (2013.01); *H04N 5/247* (2013.01); *H05K 5/0226* (2013.01); *H05K 5/03* (2013.01)

(58) Field of Classification Search
CPC .... H04N 5/2252; H04N 5/247; G06F 3/1446; H05K 5/0226; H05K 5/03
See application file for complete search history.

(56) References Cited

U.S. PATENT DOCUMENTS

| | | |
|---|---|---|
| 4,072,970 A | 2/1978 | Winkler |
| 6,334,718 B1 | 1/2002 | Akiba et al. |
| 6,898,301 B2 * | 5/2005 | Iwanaga ............ G06K 9/00026 283/68 |
| 7,106,357 B2 * | 9/2006 | Fukuda ................. G06F 1/1616 348/14.01 |
| 7,496,378 B2 | 2/2009 | Kawamura |
| 7,660,613 B2 | 2/2010 | Hamamura et al. |

(Continued)

FOREIGN PATENT DOCUMENTS

CN 204578622 U 8/2015

OTHER PUBLICATIONS

Thrystan, "Samsung Flip Foldable Phone Features a Wrap Around Screen", Published on: Jan. 9, 2012, 5 pages, Available at: http://www.concept-phones.com/samsung/samsung-flip-foldable-phone-features-wrap-screen/.

(Continued)

*Primary Examiner* — Lin Ye
*Assistant Examiner* — Chriss Yoder, III

(57) ABSTRACT

A device comprising at least two body sections is disclosed. The first body section comprises a first camera element having an optical axis, and the second body section comprises a second camera element and a mechanical flap adapted to expose and conceal the second camera element. The first body section is in a movable connection with the second body section, and the device is operable in at least two modes. In the first mode, the first and the second body sections are brought together, and the mechanical flap is adapted to expose the second camera element. In the second mode, the first and the second body sections are positioned such that the first and the second camera elements are positioned away from each other, and the mechanical flap is adapted to conceal the second camera element.

20 Claims, 4 Drawing Sheets

(56) References Cited

U.S. PATENT DOCUMENTS

| | | | |
|---|---|---|---|
| 7,677,817 B2* | 3/2010 | Vapaakoski | G03B 29/00 396/439 |
| 7,692,667 B2* | 4/2010 | Nguyen | G06F 1/1624 345/162 |
| 8,633,989 B2 | 1/2014 | Okuda | |
| 8,738,101 B1 | 5/2014 | Myr | |
| 8,803,816 B2 | 8/2014 | Kilpatrick et al. | |
| 2003/0036365 A1 | 2/2003 | Kuroda | |
| 2003/0040346 A1 | 2/2003 | Fukuda et al. | |
| 2004/0116166 A1 | 6/2004 | Makishima | |
| 2004/0183935 A1 | 9/2004 | Shimano et al. | |
| 2006/0056837 A1 | 3/2006 | Vapaakoski | |
| 2006/0172761 A1 | 8/2006 | Im et al. | |
| 2006/0203124 A1* | 9/2006 | Park | H04N 1/00493 348/376 |
| 2008/0220817 A1* | 9/2008 | Nagamine | H04M 1/0264 455/556.1 |
| 2010/0045855 A1 | 2/2010 | Tanida et al. | |
| 2010/0194860 A1 | 8/2010 | Mentz et al. | |
| 2014/0285476 A1 | 9/2014 | Cho et al. | |
| 2015/0015777 A1 | 1/2015 | Osborne et al. | |

OTHER PUBLICATIONS

Griffiths, Sarah, "Samsung's 'Foldable Valley' could launch in January: Flexible phone uses a bendy plastic display to open and close like a book", Published on: Sep. 16, 2015, 17 pages, Available at: http://www.dailymail.co.uk/sciencetech/article-3236809/Samsung-s-Foldable-Valley-launch-January-Flexible-smartphone-uses-bendy-plastic-display-open-close-like-book.html.

"Samsung has an 18.4? Tablet in the making—could fold into two when Idle", Published on: Aug. 8, 2015, 5 pages, Available at: http://bestmobs.com/samsung-an-18-4-tablet-making-27645/.

"International Search Report and Written Opinion Issued in PCT Application No. PCT/US2017/034356", dated Aug. 22, 2017, 12 Pages.

* cited by examiner

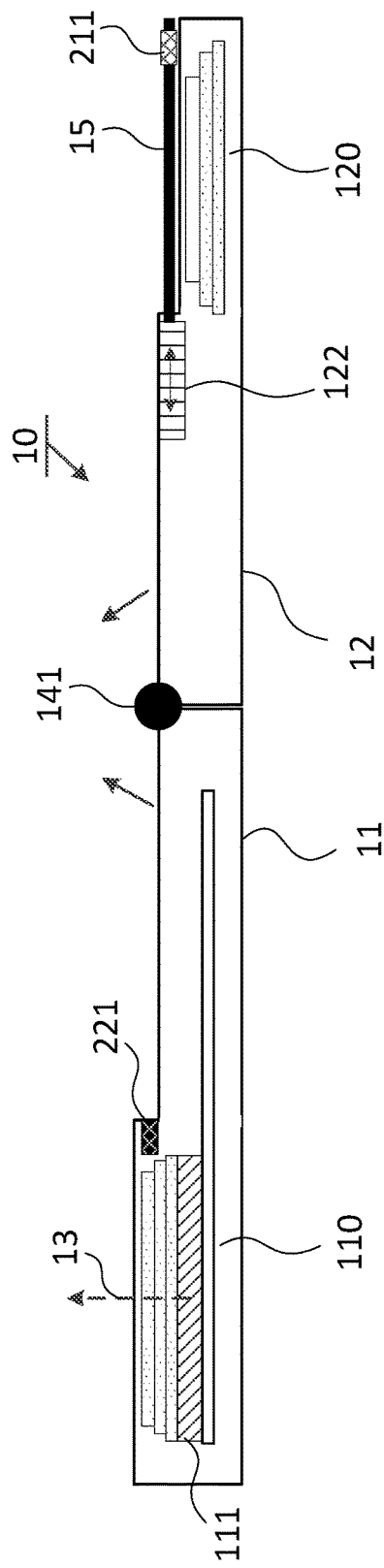
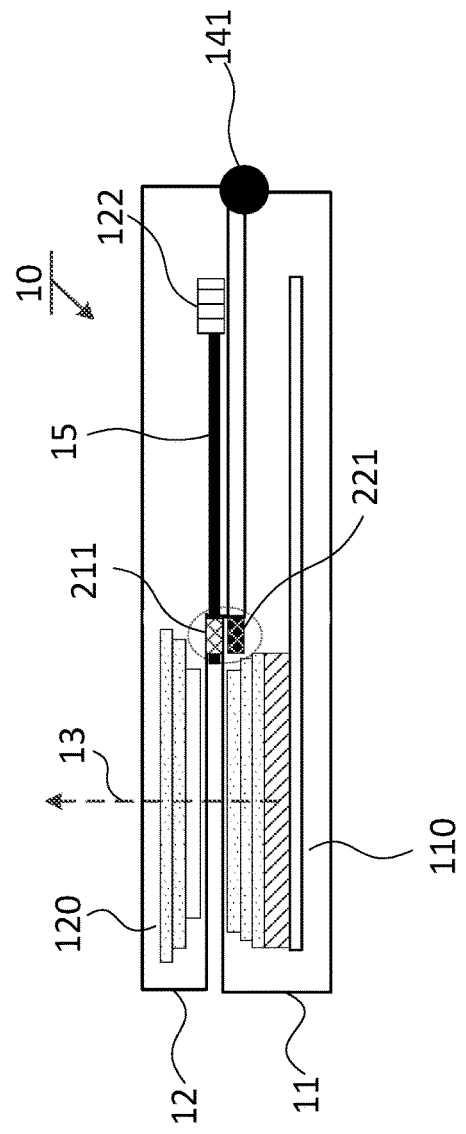

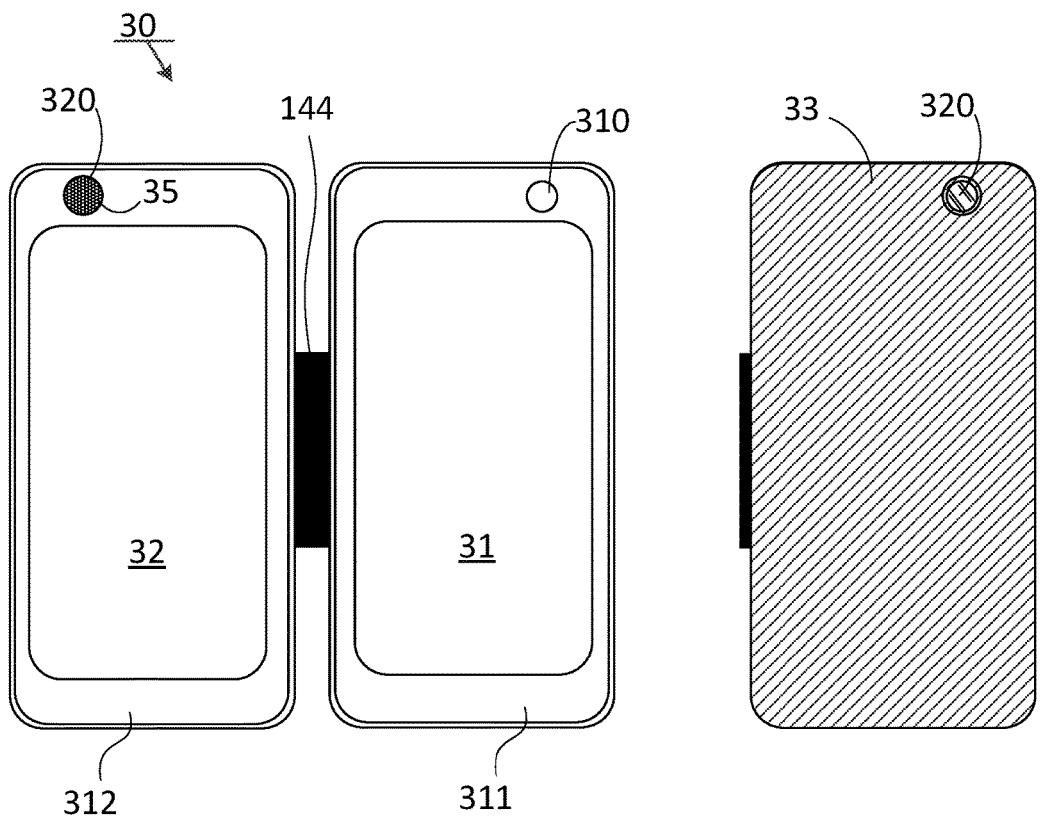
FIG. 3A  FIG. 3B
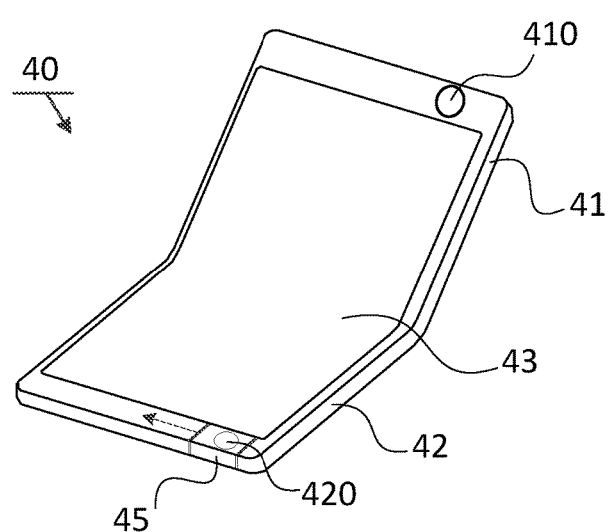
FIG. 4

TWO PART DEVICE WITH CAMERA AND MECHANICAL FLAP

BACKGROUND

Digital cameras may be incorporated in various types of mobile devices. Such digital cameras may be used to capture still images and/or videos comprising a plurality of sequential images. One type of mobile devices with digital cameras relates to devices manufactured in more than one part, such as sliding, folding or modular devices. Sliding and folding devices can have more than one camera operating separately or simultaneously. The cameras are normally protected by glass and shutter mechanisms.

The quality and properties of the captured images may be affected by use of various types of accessories for a camera.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Split electronic devices with a camera are disclosed. The present specification provides implementations of a device with two or more parts and camera elements integrated in at least two of these parts. The device has different working modes depending on the relative position of the camera elements. In a first mode the camera elements are aligned with each other to work together as a camera, and in the second mode the camera element which includes optical elements is passive and concealed by a mechanical flap, while the camera element with an image sensor may be idle or continue to work independently as a camera. Structure and movement of the mechanical flap are also discussed below.

Many of the attendant features will be more readily appreciated, as the same becomes better understood by reference to the following detailed description considered in connection with the accompanying drawings.

DESCRIPTION OF THE DRAWINGS

The present description will be better understood from the following detailed description read in light of the accompanying drawings, wherein:

FIG. 1A is a schematic illustration of foldable device according to an embodiment;

FIG. 1B is a schematic illustration of a folded device according to the embodiment of FIG. 1A;

FIG. 3A illustrates an example of a two-part device with two displays and a camera;

FIG. 3B illustrates the device according to the embodiment of FIG. 3A folded;

FIG. 4 illustrates an example of a foldable device with a single screen and a camera.

The drawings of the Figures are not necessarily to scale. Like reference numbers are used to designate like parts in the accompanying drawings.

DETAILED DESCRIPTION

Figure 2A:
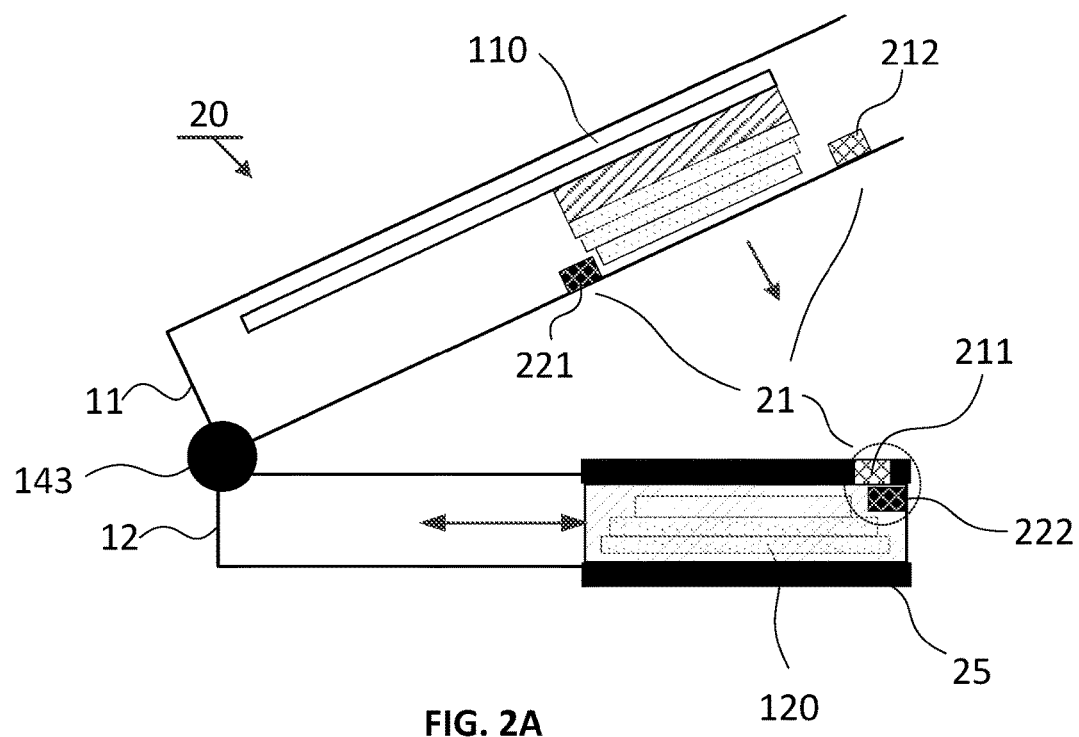
FIG. 2A is a schematic illustration of a device with a locking mechanism according to an embodiment.

The detailed description provided below in connection with the appended drawings is intended as a description of a number of embodiments and is not intended to represent the only forms in which the embodiments may be constructed, implemented, or utilized.

The drawings of the Figures represent the principles of embodiments, especially the structural details, schematically. Structural details of the devices and elements, as well as materials thereof, may be implemented and selected in any appropriate manner. Smaller elements can be visually increased in size for clarity, and the proportions may not be observed.

Among terms used hereinafter, a "camera" refers to a device, module, unit, or element comprising at least an image sensor capable of capturing digital image frames comprising image data, which can be used to reproduce and display digital images. A "camera element" can refer to any element comprised in a camera, for example an optical element such as a lens, a lens barrel, a filter; an imaging element such as an image sensor, a digital matrix; an autofocus element, an image stabilization element, or any other suitable camera element A camera element may also refer to a functional camera. In the examples presented below, the devices comprise two camera elements which can form a camera when combined together; or one of them can be a functional camera, while the other camera element is a secondary element that supplements functioning of the camera when they are brought together.

A "mobile device" may be a mobile electronic device of any type having at least one camera. Such mobile device may be, for example, a tablet computer, a phablet, a smartphone or a mobile phone, a gaming console, a wearable device, etc.

A "magnetic element" may be any element capable of desired interaction with a magnetic field. This term herein covers magnets, ferromagnetic materials, ferrimagnetic materials, antiferromagnets, paramagnetic materials, diamagnetic materials and electromagnets. Where appropriate, paired magnetic elements are elements that are capable of magnetic attraction or repulsion towards each other.

The devices shown in the Figures may be electronic devices, mobile devices, portable devices and others.

The device 10 in FIG. 1A comprises two body sections 11 and 12. These body sections 11, 12 may each comprise various parts of the device 10 such as electronics, displays, keyboards, wireless modules and others.

The first body section 11 is in a movable connection with the second body section 12. In an embodiment shown in FIGS. 1A-1B a hinge 141 provides the movable connection, and the device 10 of this embodiment is a foldable device configured to fold about the hinge 141. The hinged 141 foldable connection is described as an example only, and embodiments with other movable connections are possible.

The first body section 11 comprises a first camera element 110 having an optical axis 13. The first camera element 110 can comprise an imaging unit configured to capture images, and includes an image sensor 111. FIGS. 1A-1B also show a stack of other elements in the first camera element 110 which may comprise optics, for example a lens barrel, individual lenses, other optical elements, a substrate, a connection interface configured to connect the image sensor with other electronics (shown schematically as a prolonged layer below the image sensor 111). In an embodiment, the first camera element 110 comprises an operable digital camera.

The second body section 12 comprises a second camera element 120 and a mechanical flap 15. The second camera element 120 comprises at least one additional element, depicted on FIGS. 1A-1B as a stack of three optical elements for illustration purposes only. The second camera element 120 is positioned to match the first camera element 110 when they are brought together by closing the device 10.

The device 10 is operable in at least two modes. In the first mode the first and second body sections 11, 12 are brought together such that the second camera element 120 is exposed and optionally aligned with the optical axis 13 of the first camera element 110. The second camera element 120 and the first camera element 110 are thereby combined to operate as a camera that can capture images through the second camera element 120 onto the image sensor 111. The mechanical flap 15 is adapted to expose the second camera element 120 when the device 10 is in the first mode. The mechanical flap 15 may be, but is not limited to, a shutter.

The first mode shown in FIG. 1B is a folded mode. The shape of the body sections 11, 12 is shown to match for better alignment of the first camera element 110 and the second camera element 120 when they are brought together. However, this shape is optional and according to other embodiments the shape may be different, e.g. flat, and the device 10 may have other means of mutual alignment of the units 110, 120 along the optical axis 13.

In the second mode the sections 11, 12 are positioned such that the second camera element 120 is concealed by the mechanical flap 15 and positioned away from the optical axis 13 of the first camera element 110. In the embodiment shown in FIG. 1A the second mode is an unfolded flat position of the device 10. In the second mode, the first camera element 110 may still be active and capture images onto the image sensor 111 through an aperture (not shown) or transparent part of the casing of the first body section 11.

The second camera element 120 is concealed in the second mode and exposed in the first mode of the device 10. This protects the second camera element 120 when it is not used, or is inactive, in the second mode when the unit 120 is positioned away from the axis 13. As shown in FIGS. 1A-1B, the second camera element may be concealed by a mechanical flap 15. The mechanical flap 15 may be made of non-transparent material. The flap 15 is adapted to expose the second camera element 120 in the first mode and conceal the second camera element 120 in the second mode, so that in the first mode light coming through the second camera element 120 is not obstructed, and in the second mode the second camera element 120 is protected. An example of the flap 15 movement which allows the concealment and exposure is shown by the directional arrows on FIGS. 1A and 1B.

Movement of the mechanical flap 15 can be provided by a locking arrangement for the mechanical flap 15. The locking arrangement illustrated in FIGS. 1A-1B comprises a magnetic element 211 in the mechanical flap 15, a magnetic element 221 in the first body section 11, and a retention mechanism 122 in the second body section 12. These elements of the locking arrangement provide for movement of the flap 15 between at least two fixed positions depending on the distance between the body sections 11, 12.

In the first mode, the mechanical flap 15 is locked in a position exposing the second camera element 120 due to magnetic interaction between the magnetic elements 211, 221. In the second mode the retention mechanism 122 is adapted to position the mechanical flap 15 such that the second camera element 120 is concealed. The retention mechanism illustrated schematically on FIGS. 1A-1B may change shape and/or position in order to drive the mechanical flap 15 out of the second body section 12 or into a proper position in the body section 12 when the device 10 is opened, to provide protection for the second camera element 120. According to embodiments, the retention mechanism 122 may comprise mechanisms such as a spring or electric motor for driving the flap 15 into position concealing the second camera element 120 in the second mode. The magnetic attraction, which moves and holds the flap 15 in place in the first operation mode, is highlighted by ovals on FIGS. 1A-2B and other drawings.

Using a mechanical flap 15 provides an effect of additional protection of the second camera element 120 in the second mode, for example protection from smudges, dust and any other damage caused by day-to-day use.

Material of the casing of body sections 11, 12 may be any suitable material or combination of materials such as glass, plastic, metal and others. Without regard to the material of the whole casing, all elements and materials of the casing of body sections 11, 12 along the optical axis 13 are transparent to light of appropriate wavelengths so that the light can reach the image sensor 111 both in the first mode and in the second mode. The wavelength depends on the type of the image sensor, for example for a digital photo camera the image sensor may be sensitive to light of wavelength from approximately 340 nanometers to 1000 nanometers, or to a narrower spectrum between approximately 400 and 700 nanometers. Any subranges are also possible for specific image sensor types.

The casing of the body sections 11, 12 may comprise an aperture not shown in FIGS. 1-2 but shown on FIG. 3. In an embodiment, the second mode in which the second camera element 120 is positioned away from the axis 13 and concealed by the flap 15 is an idle mode for the first camera element 110, meaning that the camera functions of the device 10, 20 are switched off. In alternative embodiments, the second mode is also an active mode wherein only the first camera element 110 is used as a camera.

The above embodiments are illustrated with a foldable device 10 comprising a hinge 143, although the embodiment may also be used with other movable connections between the first and second body sections 11, 12.

Figure 2B:
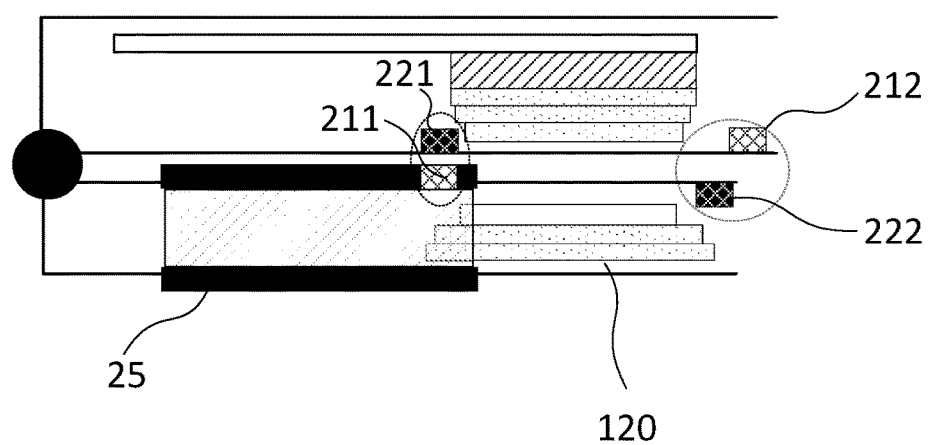
FIG. 2B is a schematic illustration of a closed device according to the embodiment of FIG. 3A.

The device 20 on FIGS. 2A-2B is illustrated "flipped over" compared to the devices 10 and 20 shown in FIGS. 1A-1B. FIGS. 2A-2B show a top (or bottom) view of an example embodiment wherein the flap 25 is illustrated overarching the top (or bottom) side of the second body section 12 that covers both sides of said body section 12. The flap 25 may cover only a predefined area around the second camera element 120 or extend throughout the length of the second body section 12.

In the embodiment illustrated in FIGS. 2A-2B, the locking arrangement 21 may comprise any number of additional magnetic elements. The retention mechanism 122 comprises at least one additional magnetic element 222 in the second body section 12 adapted to lock the mechanical flap 25 in the second mode and release the mechanical flap 25 in the first mode. The mechanical flap 25 is locked in the second mode due to magnetic attraction between the elements 211 and 222. The additional magnetic element 212 may also be magnetically attracted to the element 222 in the first mode, providing a secure locked position for the device 20 in the first mode. Striped black and white patterns of the magnets 211, 212, 221 and 222 illustrate opposite polarities.

A technical effect provided by the locking arrangement 122, 21 consists in that any of the first and second modes of the device can be effectively activated mechanically not requiring any electric connections or electronic elements.

This mechanical switching can occur when the device is switched off or the camera is in a fully mechanical mode.

The device 10, 20 may be operable in more than two modes according to embodiments. The mode in which the second camera element 120 is exposed and used with the first camera element 110, and the mode in which the second camera element 120 is concealed and the first camera element comprising an imaging unit is either idle or functions independently, could be two of a plurality of modes of operation of the device 10, 20 and the first camera element 110.

In the embodiment illustrated in FIGS. 2A-2B (and unlike the embodiment of FIGS. 1A-1B), the hinge is positioned near the first camera element 110 and the second camera element 120. The arrangement provides additional accuracy in alignment of the elements 110, 120. The shape of the body sections 11, 12 is also illustrated to be flat. The mentioned structural features are optional and presented for exemplary purposes only, the feature is interchangeable with other structural features such as the ones presented in FIGS. 1A-1B. The presented embodiments are useful in any other two-part device, hinged device, or modular device with two body sections 11, 12.

According to an embodiment, the device 10, 20 comprises a position-sensing element adapted to detect the relative position of the first body section 11 and the second body section 12, at least one processor, and a memory including computer program code. The memory may be configured to store images captured by the camera. The device 10, 20 according to any other embodiment may also include at least one processor, memory and other elements of an electronic device such as one or more displays.

In this embodiment, the computer program code and the at least one memory are configured, with the at least one processor, to cause the device to enter the first mode upon detection by the position-sensing element that the first body section 11 and the second body section 12 are brought together such that the second camera element 120 is exposed and aligned with the optical axis 13 of the first camera element 110; and enter the second mode upon detection by the position-sensing element that the first body section 11 and the second body section 12 are positioned such that the second camera element 120 is concealed and positioned away from the optical axis 13 of the first camera element 110. The position-sensing element may comprise a magnetic sensing arrangement, detecting presence and strength of a magnetic field; a proximity sensor based on Radio Frequency Identification RFID or Near Field Communication NFC; or other position-sensing elements.

The position-sensing element may produce, when in use, a position signal, which depends on the relative position of the body sections 11, 12. The position signal may then be transferred to the processor and cause additional movement or adjustment of the mechanical flap 15, 25.

The second camera element 120 may include additional passive and/or active optical elements. The passive additional optical elements include one or more additional lenses, optical filters, for example polarization filters, and other elements which affect properties of the resulting image captured by the image sensor 111. For example these properties can be the spectrum, polarization state of light incident on and propagating through the optical element, field of view of the resulting image, colors etc. For example, the second camera element 120 may include a lens which changes the field of view resulting camera, making the pictures more appropriate for scenery shots in the first mode and for portrait or selfie shots in the second mode as a technical effect.

Passive additional optical elements do not require the second camera element 120 to be electrically connected to the first camera element or other elements of the device 10, which reduces the amount of connectors needed. A further technical effect is that the first and second modes of the device 10 can be activated mechanically without the software or hardware "recognizing" the position of the first and second body sections 11, 12. The first mode can be activated by bringing the body sections together and using the aligned first camera element 110 and second camera element 120 together as a combined camera, and the second mode can be activated by bringing the body sections 11, 12 apart and using the device 10 in an opened position.

The active additional optical elements comprised in the second camera element 120 can be elements which can perform an active function. In an embodiment, the active optical element is a focusing element, for example an autofocus. According to an embodiment, the active optical element can be an image stabilization element. In order to perform the active function, the second camera element 120 is electrically connected to the first camera element 110 and synchronized with the first camera element 110 in the first folded mode. In an embodiment, the second camera element may alternatively be electrically connected to a controller comprising a processor. The second body section 12 may comprise additional space for the second camera element 120 with active additional optical elements to allow for lateral or vertical movement of the stabilization elements or autofocus. The second camera element 120 may also comprise a shutter as an active additional optical element. The shutter can be configured to open in the first mode and close in the second mode of the device 10, or the shutter may be configured to be synchronized with the first camera element to open only for a period of time necessary to take a picture, in accordance with predetermined exposure time, or a video.

FIGS. 3A-3B shows an implementation of a device 30 according to an embodiment. The Figure shows a mobile device 30 with two body sections 311, 312 movably connected to each other by a hinge 144. Each body section comprises a display 31, 32 on FIGS. 3A-3B. In alternative embodiments, the display may only be present in one of the body sections 311, 312 and on any side of the body section 311, 312. The first body section 311 comprises an imaging unit 310, such as a camera or an image sensor. The second body section 312 comprises an optical unit 320. FIG. 3A shows the second operation mode of the device 30 in which the device 30 is unfolded, the optical unit 320 concealed by using a flap or shutter 35, and the imaging unit 310 either idle or active as an independent camera. FIG. 3B shows the first operation mode in which the device 30 is folded and the optical unit 320 exposed, so that the imaging unit 310 is operable through the optical unit 320 as a combined camera. The surface 33 may be a protective outer surface of the second body section 312. In an embodiment the surface 33 may comprise at least one additional display or additional cameras. The flap or shutter 35 is illustrated in FIGS. 3A-3B implemented inside the body section 312 as an example only.

As illustrated by the example of FIGS. 3A-3B, the first camera element 110, 310 of the device 10, 20, 30 according to the above embodiments may be used both as a front-facing camera and as a rear-facing camera depending on mode of operation of the device. This technical effect can be used for example when the device is a foldable mobile device, and the imaging unit is used as a front-facing camera when the device is opened (second mode), while using the same imaging unit as a back-facing camera when the device is closed (first mode) and the images are enhanced by the second camera element.

FIG. 4 shows another example of a portable electronic device 40 using the above-described embodiments. This implementation provides a device with two body sections 41, 42 and a single flexible display 43 attached to both body sections 41, 42. The device 40 comprises a first camera element 410 and a second camera element 420 and is operable in at least two modes: open and closed. The second camera element 420 is covered by a mechanical flap 45 (shown to be transparent for clarity only) which is adapted to cover the second camera element 420 in the open mode of the device, and to move to the side when the device is closed, making the first camera element 410 operable through the second element 420.

According to an aspect, the device is a modular electronic device. The first and second body sections of the device are detachable. In the first operating mode the first and second body sections are attached to each other; in the second operating mode the second body section is detached from the first body section and at least the first body section can be used independently. The device may still be a foldable device with detachable body sections.

Some or all of the above embodiments have a technical effect of making use of the several body sections that a foldable or modular device may have. The split imaging and optical units that can supplement each other when the device is closed operate in synergy with any of the presented structures. The embodiments described herein may be used in combination with any number of additional cameras that the device may have.

Figure 5:
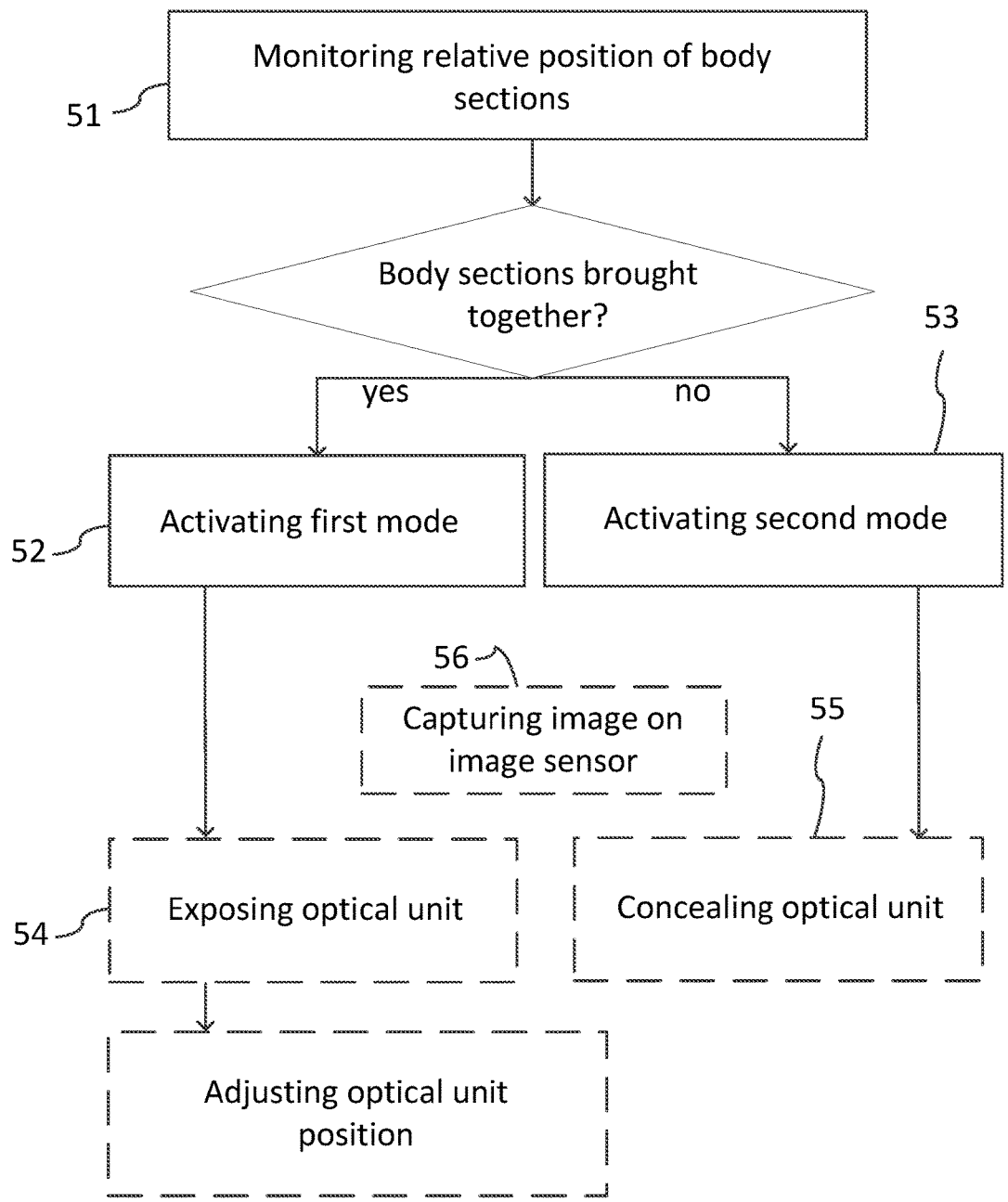
FIG. 5 is a block diagram of a method according to an aspect.

FIG. 5 is a flow chart of a method according to an aspect. It is a method of operating a device comprising a processor; a position-sensing element; and a first and second body sections with an imaging unit and optical unit similar to the embodiments described above. A controller, a processing unit or a processor of the device can carry out the method. Optional parts of the method are illustrated by boxes with dashed borders.

The method comprises 51 monitoring the relative position of the first body section and the second body section by receiving detections made by the position-sensing element. The detections may be received periodically at a predetermined rate. A first mode of the device is activated 52 upon receipt of a detection from the position-sensing element that the first body section and the second body section are brought together such that the optical unit is aligned with the imaging unit. A second operation mode of the device is activated 53 upon receipt of a detection from the position-sensing element that the first body section and the second body section are positioned such that the optical unit is positioned away from the imaging unit.

The method may also comprise capturing 56 an image formed on an image sensor of the imaging unit in the first mode of the device or in the second mode of the device, and storing the captured image in a memory. The image capture may prompted by a command from an image capture control unit, manual image capture interface or image capture software.

In an embodiment, wherein activating 51 the first mode of the device comprises activating a first camera mode in a camera software of the device, and activating 52 the second mode comprises activating a second camera mode in the camera software of the device. The software may have predetermined or user-defined settings for each operation mode, which according to the method activate automatically upon activation of the first and second mode. For example, the software may comprise instructions to activate a scenery mode when the first mode of the device is activated, and activate a portrait or selfie mode when the second mode of the device is activated.

According to an embodiment, the method also comprises exposing 54 the optical unit upon activation of the first mode of the device, and concealing 55 the optical unit upon activation of the second mode of the device. The concealing 55 and exposing 54 may be carried out mechanically or by sending a command to an electric motor configured to move the shutter or flap.

The method may further comprise adjusting 56 the position of the optical unit upon activation of the first mode of the device such that the optical unit is aligned with the optical axis of the imaging unit. This can include prompting lateral and/or vertical movement for better alignment of the optical unit with the optical axis of the imaging unit.

The functionally described features can be performed by a processor, or, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Embodiments are further discussed shortly in the following.

According to a first aspect, a device is disclosed. The device comprises: a first body section comprising a first camera element, and a second body section comprising a second camera element and a mechanical flap. The first body section is in a movable connection with the second body section, and the device is operable in at least two modes. In the first mode the first and the second body sections are brought together, and the mechanical flap is adapted to expose the second camera element, and in the second mode the first and the second body sections are positioned such that the first and the second camera elements are positioned away from each other, and the mechanical flap is adapted to conceal the second camera element.

In an embodiment, in addition to the above embodiment, the device comprises a hinge, wherein the first body section is in a folding movable connection with the second body section about the hinge.

In an embodiment, in addition to the above embodiment, in the first mode the device is folded and in the second mode the device is unfolded.

In an embodiment, alternatively or in addition to the above embodiments, the device comprises a locking arrangement for the mechanical flap, the locking arrangement comprising: at least one magnetic element in the mechanical flap, at least one magnetic element in the first body section, a retention mechanism attached to the mechanical flap in the second body section. In the first mode the mechanical flap is locked in a position exposing the second camera element due to magnetic interaction between the at least one magnetic element in the mechanical flap and the at least one magnetic element in the first body section, and in the second mode the retention mechanism is adapted to position the mechanical flap such that the second camera element is concealed.

In an embodiment, in addition to the above embodiment, the retention mechanism is selected from a group of: a spring, an electrical motor, and at least one additional magnetic element.

In an embodiment, in addition to the above embodiment, the retention mechanism comprises at least one additional magnetic element in the second body section adapted to lock the mechanical flap in the second mode and release the mechanical flap in the first mode.

In an embodiment, alternatively or in addition to the above embodiments, the first camera element has an optical axis, and in the first mode the position of the second camera element is aligned with the optical axis of the first camera element.

In an embodiment, alternatively or in addition to the above embodiments, the first camera element is an imaging unit comprising an image sensor.

In an embodiment, in addition to the above embodiment, the imaging unit further comprises at least one lens.

In an embodiment, alternatively or in addition to the above embodiments, the second camera element is an optical unit which comprises at least one additional optical element, and in the first mode the first and the second body sections are brought together such that the at least one additional optical element and first camera element are operable together as a camera with an optical axis.

In an embodiment, in addition to the above embodiment, at least one additional optical element is selected from the group of: an optical filter and an additional lens.

In an embodiment, the device comprises a position-sensing element adapted to detect the relative position of the first body section and the second body section, at least one processor, and a memory including computer program code, wherein the memory is configured to store images captured by the imaging unit. The computer program code and the at least one memory are configured, with the at least one processor, to cause the device to: enter the first mode upon detection by the position-sensing element that the first and the second body sections are brought together such that the second camera element is exposed and aligned with the optical axis of the second camera element, and enter the second mode upon detection by the position-sensing element that the first body section and the second body section are positioned such that the second camera element is concealed and positioned away from the optical axis of the first camera element.

In an embodiment, alternatively or in addition to the above embodiments, the mechanical flap covers a predefined area on both sides of the second body section around the second camera element.

In an embodiment, alternatively or in addition to the above embodiments, the device comprises at least one display attached to the first body section or the second body section.

In an embodiment, alternatively or in addition to the above embodiments, the device described above is a portable electronic device.

According to an aspect, a system is presented. The system comprises: a first module comprising a first camera element and at least one magnetic element, a second module comprising second camera element, a retention mechanism and a mechanical flap attached to the retention mechanism, the mechanical clap comprising at least one magnetic element. The first module is in a movable connection with the second module, and the system is operable in at least two modes. In the first mode the first and the second modules are brought together, and the mechanical flap is locked in a position exposing the second camera element due to magnetic interaction between the at least one magnetic element in the mechanical flap and the at least one magnetic element in the first module. In the second mode the first and the second modules are positioned away from each other, and the retention mechanism is adapted to position the mechanical flap such that the second camera element is concealed.

In an embodiment, in addition to the above embodiment, the retention mechanism is selected from a group of: a spring, an electrical motor, and at least one additional magnetic element.

In an embodiment, in addition to the above embodiment, the retention mechanism comprises at least one additional magnetic element in the second body section adapted to lock the mechanical flap in the second mode and release the mechanical flap in the first mode.

In an embodiment, alternatively or in addition to the above embodiments, the system comprises a hinge, wherein the first module is in a folding movable connection with the second module about the hinge.

According to an aspect, a foldable electronic device is presented. The device comprises: a first body section comprising a camera having an optical axis, a second body section comprising at least one additional optical element, a hinge connecting the first body section to the second body section, and a mechanical flap adapted to conceal the at least one additional optical element. The device is operable in at least two modes. In the first mode the device is folded by bringing the first body section and the second body section together, the mechanical flap is open exposing the optical element, the optical element is aligned with the optical axis of the camera, and the camera is operable through the optical element. In the second mode, the device is unfolded by separating the first body section and the second body section from each other about the hinge, the mechanical flap is closed concealing the optical element, and the optical element is positioned away from the optical axis of the camera.

Although some of the present embodiments may be described and illustrated herein as being implemented in a smartphone, a mobile camera, or a tablet computer, these are only examples of a device and not a limitation. As those skilled in the art will appreciate, the present embodiments are suitable for application in a variety of different types of mobile devices such as game consoles or game controllers, various wearable devices, portable cameras and others.

Although the subject matter has been described in language specific to structural features and/or methodological acts, it is to be understood that the subject matter defined in the appended claims is not necessarily limited to the specific features or acts described above. Rather, the specific features and acts described above are disclosed as exemplary forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It is further understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The embodiments illustrated and described herein as well as embodiments not specifically described herein but within the scope of aspects of the invention constitute exemplary means for operating a device with a split camera. For example, the elements illustrated and described with reference to FIGS. 1-4, when configured to perform the operations illustrated and described with reference to FIG. 5, constitute exemplary means for monitoring the relative position of the imaging unit and the optical unit by receiving detections made by the digital alignment element, exemplary means for activating a first mode of the device upon receipt of a detection from the digital alignment element that the imaging unit and the optical unit are brought together, exemplary means for prompting the digital alignment element to adjust the position of the optical unit such that the imaging unit and the optical unit are fixed in a set relative position, and exemplary means for activating a second mode of the device upon receipt of a detection from the digital alignment element that the optical unit is positioned away from the imaging unit.

The term "comprising" is used in this specification to mean including the features followed thereafter, without excluding the presence of one or more additional features.

The invention claimed is:

1. A device comprising:
a first body section comprising a first camera element and at least one magnetic element,
a second body section comprising a second camera element, at least one magnetic element, a mechanical flap, and a retention mechanism attached to the mechanical flap,
wherein:
the first body section is in a movable connection with the second body section, and
the device is operable in at least two modes:
in the first mode the first and the second body sections are brought together, the mechanical flap is adapted to expose the second camera element, and the mechanical flap is locked in a position exposing the second camera element due to magnetic interaction between the at least one magnetic element in the second body section and the at least one magnetic element in the first body section, and
in the second mode the first and the second body sections are positioned such that the first and the second camera elements are positioned away from each other, the mechanical flap is adapted to conceal the second camera element, and the retention mechanism is adapted to position the mechanical flap such that the second camera element is concealed.

2. A device as defined in claim 1 comprising a hinge, wherein the first body section is in a folding movable connection with the second body section about the hinge.

3. A device as defined in claim 2, wherein in the first mode the device is folded and in the second mode the device is unfolded.

4. A device as defined in claim 1, wherein the mechanical flap comprises the second magnetic element.

5. A device as defined in claim 1, wherein the retention mechanism is selected from a group of: a spring, an electrical motor, and at least one additional magnetic element.

6. A device as defined in claim 1, wherein the at least one magnetic element in the second body section is adapted to lock the mechanical flap in the second mode and release the mechanical flap in the first mode.

7. A device as defined in claim 1, wherein the first camera element has an optical axis, and in the first mode the position of the second camera element is aligned with the optical axis of the first camera element.

8. A device as defined in claim 1, wherein the first camera element is an imaging unit comprising an image sensor.

9. A device as defined in claim 8, wherein the imaging unit further comprises at least one lens.

10. A device as defined in claim 1, wherein
the second camera element is an optical unit which comprises at least one additional optical element, and
in the first mode the first and the second body sections are brought together such that the at least one additional optical element and first camera element are operable together as a camera with an optical axis.

11. A device as defined in claim 10, wherein at least one additional optical element is selected from the group of: an optical filter and an additional lens.

12. A device as defined in claim 1, comprising
a position-sensing element adapted to detect the relative position of the first body section and the second body section,
at least one processor, and
a memory including computer program code, wherein
the first camera element has an optical axis;
the memory is configured to store images captured by the imaging unit; and
the computer program code and the at least one memory are configured, with the at least one processor, to cause the device to:
enter the first mode upon detection by the position-sensing element that the first and the second body sections are brought together such that the second camera element is exposed and aligned with the optical axis of the first camera element, and
enter the second mode upon detection by the position-sensing element that the first body section and the second body section are positioned such that the second camera element is concealed and positioned away from the optical axis of the first camera element.

13. A device as defined in claim 1, wherein the mechanical flap covers a predefined area on both sides of the second body section around the second camera element.

14. A device as defined in claim 1, comprising at least one display attached to the first body section or the second body section.

15. A device is defined in claim 1, wherein the device is a portable electronic device.

16. A system comprising:
a first module comprising a first camera element and at least one magnetic element,
a second module comprising a second camera element, a retention mechanism, a mechanical flap attached to the retention mechanism, and at least one magnetic element, wherein:
the first module is in a movable connection with the second module, and
the system is operable in at least two modes:
in the first mode the first and the second modules are brought together, and the mechanical flap is locked in a position exposing the second camera element due to magnetic interaction between the at least one magnetic element in the second module and the at least one magnetic element in the first module; and
in the second mode the first and the second modules are positioned away from each other, and the retention mechanism is adapted to position the mechanical flap such that the second camera element is concealed.

17. A system as defined in claim 16, wherein the retention mechanism is selected from a group of: a spring, an electrical motor, and at least one additional magnetic element.

18. A system as defined in claim 16, wherein the at least one magnetic element in the second module is adapted to lock the mechanical flap in the second mode and release the mechanical flap in the first mode.

19. A system as defined in claim 16 comprising a hinge, wherein the first module is in a folding movable connection with the second module about the hinge.

20. A foldable electronic device, comprising:
   a first body section comprising at least one magnetic element, and a camera having an optical axis,
   a second body section comprising at least one magnetic element, and at least one additional optical element,
   a hinge connecting the first body section to the second body section, and
   a mechanical flap adapted to conceal the at least one additional optical element;
   wherein the device is operable in at least two modes:
   in the first mode the device is folded by bringing the first body section and the second body section together, the mechanical flap is open exposing the optical element due to magnetic interaction between the at least one magnetic element in the second body section and the at least one magnetic element in the first body section, the optical element is aligned with the optical axis of the camera, and the camera is operable through the optical element; and
   in the second mode the device is unfolded by separating the first body section and the second body section from each other about the hinge, the mechanical flap is closed concealing the optical element, and the optical element is positioned away from the optical axis of the camera.

* * * * *